United States Patent
Wallace et al.

(10) Patent No.: US 6,788,073 B2
(45) Date of Patent: Sep. 7, 2004

(54) DATA PROCESSING SYSTEMS HAVING MISMATCHED IMPEDANCE COMPONENTS

(75) Inventors: Douglas E. Wallace, Austin, TX (US); Steven J. Lash, Leander, TX (US); Stephanus D. Saputro, Austin, TX (US)

(73) Assignee: Dell Products L.P., Round Rock, TX (US)

(*) Notice: Subject to any disclaimer, the term of this patent is extended or adjusted under 35 U.S.C. 154(b) by 67 days.

(21) Appl. No.: 10/236,807

(22) Filed: Sep. 6, 2002

(65) Prior Publication Data

US 2003/0038639 A1 Feb. 27, 2003

Related U.S. Application Data

(63) Continuation-in-part of application No. 09/472,078, filed on Dec. 23, 1999, now abandoned.

(51) Int. Cl.[7] .................. G01R 27/32; G01R 31/11; H05K 7/10
(52) U.S. Cl. .................. 324/642; 324/534; 361/777
(58) Field of Search ................. 324/642, 534, 324/532, 535; 333/33; 439/91, 108; 716/4, 1

(56) References Cited

U.S. PATENT DOCUMENTS

| | | | | |
|---|---|---|---|---|
| 3,651,432 A | * | 3/1972 | Henschen et al. | 333/33 |
| 5,498,965 A | | 3/1996 | Mellitz | 324/532 |
| 5,696,949 A | * | 12/1997 | Young | 713/400 |
| 5,764,489 A | * | 6/1998 | Leigh et al. | 361/777 |
| 5,842,877 A | | 12/1998 | Martensson et al. | 439/91 |
| 6,053,751 A | | 4/2000 | Humphrey | 439/106 |
| 6,150,895 A | * | 11/2000 | Steigerwald et al. | 333/12 |
| 6,236,572 B1 | | 5/2001 | Teshome et al. | 361/794 |
| 6,357,018 B1 | | 3/2002 | Stuewe et al. | 714/37 |
| 6,530,062 B1 | * | 3/2003 | Liaw et al. | 716/2 |

OTHER PUBLICATIONS

Direct Rambus™ RIMM™ Connector Specification 1.01, Mar. 1999.

* cited by examiner

Primary Examiner—N. Le
Assistant Examiner—Donald M. Lair
(74) Attorney, Agent, or Firm—Baker Botts L.L.P.

(57) ABSTRACT

A data processing system having mismatched impedance components and method of use is disclosed. In one embodiment, the method includes exciting a printed circuit board circuit having mismatched impedance printed circuit board components. Measuring at least one impedance of the circuit with a time domain reflectometer. In response to the measured at least one impedance of the circuit, adjusting at least one printed circuit board circuit element.

23 Claims, 11 Drawing Sheets

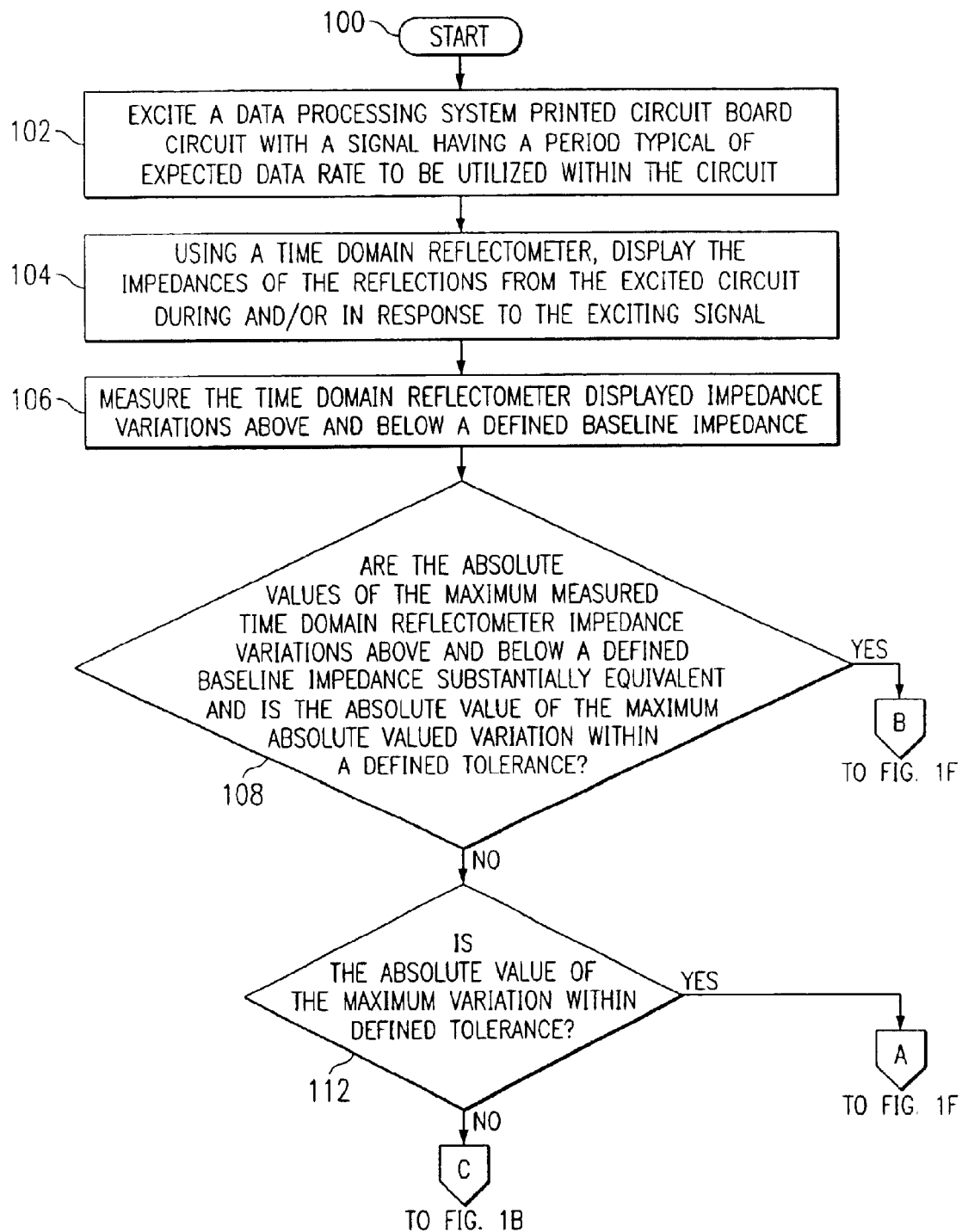

FROM FIG. 1A AND 1C

*FIG. 1B*

114 — ADJUST ELECTRICAL CHARACTERISTICS (e.g., PHYSICAL GEOMETRY) OF PRINTED CIRCUIT BOARD COMPONENT MOST ASSOCIATED WITH THE MAXIMUM ABSOLUTE VALUE VARIATION (A COMPONENT CAN TYPICALLY BE ASSOCIATED WITH THE MAXIMUM ABSOLUTE VALUE VARIATION BECAUSE THE TIME DOMAIN REFLECTOMETER RECORDS THE REFLECTIONS BY THE ELECTROMAGNETIC ENERGY (i.e., EXCITING SIGNAL) AS IT TRAVELS ALONG THE CIRCUIT, THE REFLECTIONS DISPLAYED ON THE TIME DOMAIN REFLECTOMETER CAN GENERALLY BE ASSOCIATED WITH STRUCTURES WITH PHYSICALLY UNIQUE GEOMETRIES AS THE ELECTROMAGNETIC ENERGY TRANSITS THE CIRCUIT) IN FASHION SUCH THAT MAXIMUM VARIATION MOVES TOWARD DEFINED TOLERANCE

142 — EXCITE A DATA PROCESSING SYSTEM PRINTED CIRCUIT BOARD CIRCUIT WITH A SIGNAL HAVING A PERIOD TYPICAL OF EXPECTED DATA RATE TO BE UTILIZED WITHIN THE CIRCUIT

144 — USING A TIME DOMAIN REFLECTOMETER, DISPLAY THE IMPEDANCES OF THE REFLECTIONS FROM THE EXCITED CIRCUIT DURING AND/OR IN RESPONSE TO THE EXCITING SIGNAL

146 — MEASURE THE TIME DOMAIN REFLECTOMETER DISPLAYED IMPEDANCE VARIATIONS ABOVE AND BELOW A DEFINED BASELINE IMPEDANCE

116 — IS THE ABSOLUTE VALUE OF THE MAXIMUM VARIATION WITHIN DEFINED TOLERANCE?

YES →  TO FIG. 1F

NO → D TO FIG. 1C

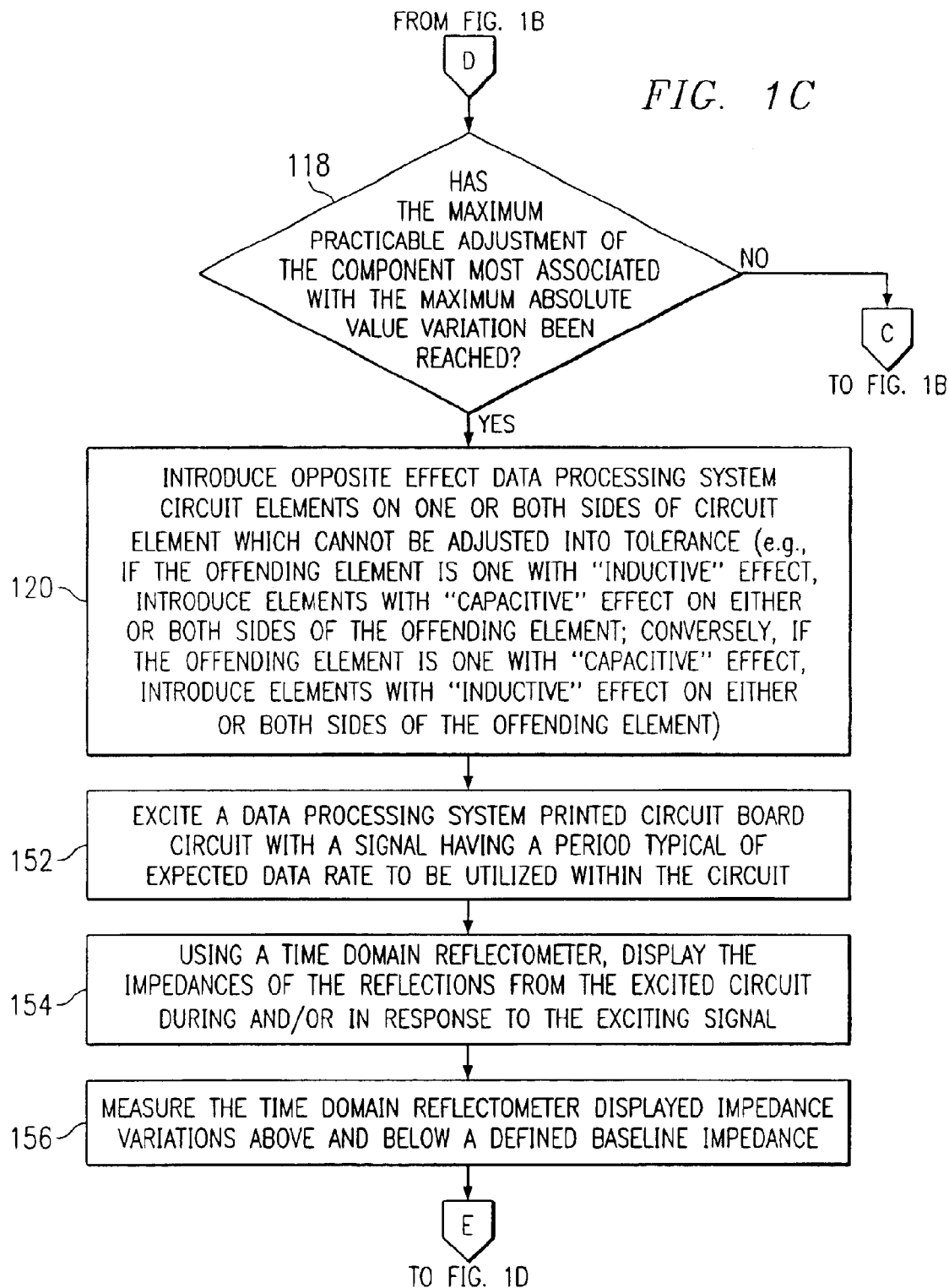

FROM FIG. 1F

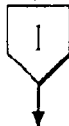

*FIG. 1E*

134 — ADJUST ELECTRICAL CHARACTERISTICS (e.g., PHYSICAL GEOMETRY) OF PRINTED CIRCUIT BOARD COMPONENT MOST ASSOCIATED WITH THE MAXIMUM ABSOLUTE VALUE VARIATION (A COMPONENT CAN TYPICALLY BE ASSOCIATED WITH THE MAXIMUM ABSOLUTE VALUE VARIATION BECAUSE THE TIME DOMAIN REFLECTOMETER RECORDS THE REFLECTIONS BY THE ELECTROMAGNETIC ENERGY (i.e., EXCITING SIGNAL) AS IT TRAVELS ALONG THE CIRCUIT, THE REFLECTIONS DISPLAYED ON THE TIME DOMAIN REFLECTOMETER CAN GENERALLY BE ASSOCIATED WITH STRUCTURES WITH PHYSICALLY UNIQUE GEOMETRIES AS THE ELECTROMAGNETIC ENERGY TRANSITS THE CIRCUIT) IN SUCH A FASHION THAT THE ABSOLUTE VALUES OF THE MAXIMUM MEASURED TIME DOMAIN REFLECTOMETER IMPEDANCE VARIATIONS ABOVE AND BELOW A DEFINED BASELINE IMPEDANCE BECOME SUBSTANTIALLY EQUIVALENT

172 — EXCITE A DATA PROCESSING SYSTEM PRINTED CIRCUIT BOARD CIRCUIT WITH A SIGNAL HAVING A PERIOD TYPICAL OF EXPECTED DATA RATE TO BE UTILIZED WITHIN THE CIRCUIT

174 — USING A TIME DOMAIN REFLECTOMETER, DISPLAY THE IMPEDANCES OF THE REFLECTIONS FROM THE EXCITED CIRCUIT DURING AND/OR IN RESPONSE TO THE EXCITING SIGNAL

176 — MEASURE THE TIME DOMAIN REFLECTOMETER DISPLAYED IMPEDANCE VARIATIONS ABOVE AND BELOW A DEFINED BASELINE IMPEDANCE

TO FIG. 1F

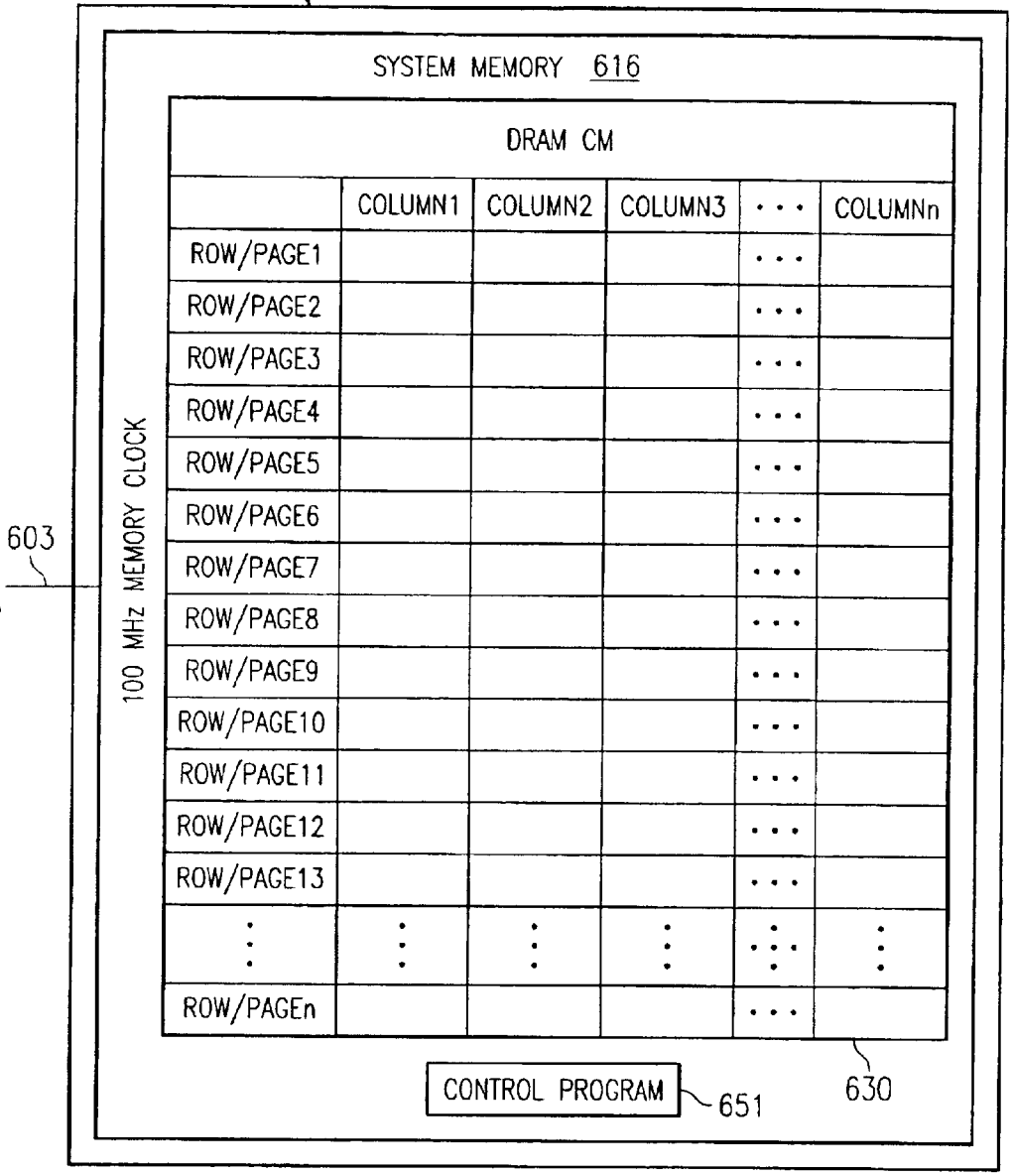

DATA PROCESSING SYSTEMS HAVING MISMATCHED IMPEDANCE COMPONENTS

CROSS REFERENCE TO RELATED APPLICATION

This application is a continuation-in-part of U.S. patent application Ser. No. 09/472,078 filed by Douglas E. Wallace Jr. et al. on Dec. 23, 1999, entitled "Data Processing Systems Having Mismatched Impedance Components", now abandoned.

BACKGROUND OF THE INVENTION

1. Field of the Invention

The present invention relates, in general, to implementing mismatched impedance components within data processing systems.

2. Description of the Related Art

Data processing systems are systems that manipulate, process, and store data and are notorious within the art. Personal computer systems, and their associated subsystems, constitute well known examples of data processing systems.

Personal computer systems typically include a main printed circuit board ("motherboard") for mounting at least one microprocessor and other application specific integrated circuits (ASICs), such as memory controllers, input/output (I/O) controllers, and the like. Most motherboards include slots for additional adapter cards (e.g., "daughter boards") to provide additional function to the computer system. Typical functions that a user might add to a computer include additional microprocessors, additional memory, fax/modem capability, sound cards, graphics cards, or the like. The slots included on the motherboard generally include in-line electrical connectors having electrically conductive connector wipers which receive exposed fingerpads on the adapter cards. The connector wipers are connected to conductive vias, which in turn are connected to metallic traces on the printed circuit board which allow the components on the cards (e.g., memory modules) to communicate with one or more microprocessors or other components in the system.

A data processing system may include many different types of buses to link the various components of the system. Such buses are conventionally implemented as metallic traces on printed circuit boards.

In conventional data processing system design, it is typical to utilize various "off the shelf" components from one or more vendors in order to implement a data processing system. It has long been assumed in the data processing system art that it is preferable for such "off the shelf components" to have essentially the same "Thevenin" equivalent impedances, because in classical circuit theory, conventionally used in data processing system design, matching Thevenin impedances of interconnected components are conventionally understood to allow for maximum power transfer and hence the greatest efficiency. In light of the foregoing, by a process of evolution, a de facto "standard" has arisen within the data processing system art in which the impedances of various data processing system components, such as printed circuit board components, which interface and interconnect with various other data processing system components, generally have a characteristic impedance of roughly 60 ohms.

The emergence of this de facto "standard" of roughly 60 ohms historically freed data processing system designers to innovate. That is, so long as the data processing system component designers ensured that the characteristic impedance of whatever component those designers were designing was roughly equal to 60 ohms, those designers could rely on the assumption that their so-designed components were electrically compatible with the rest of the data processing system. For example, computer memory module designers have long designed their computer memory modules to have characteristic impedances of roughly 60 ohms.

Relatively recently, engineers at the RAMBUS corporation, in an effort to get increased speed and efficiency in computer memory, decided to ignore the long-standing industry tradition of creating data processing system components which have characteristic impedances of 60 ohms. Instead, these designers chose to design their computer memory modules with 28 ohm characteristic impedances. In support of their memory modules, the RAMBUS corporation specified a printed circuit board connector which has a 28 ohm characteristic impedance.

A specification for a printed circuit board connector, entitled Direct RAMBUS™ RIMM™ Connector Specification, Rev. 1.01 by the RAMBUS Corporation (the "Connector Specification") is directed toward a small connector with relatively few components. Due to the speed and popularity of RAMBUS memory modules, desktop workstation data processing system designers have begun to design their systems to utilize RAMBUS memory modules. Unfortunately, when the inventors herein named (hereinafter, "the inventors") have tried to implement these desktop system designs, the inventors have found that the Connector Specification printed circuit board connector (composed of a RAMBUS socket and a RAMBUS board edge connector) is too physically weak to work well in a desktop system environment. For example, in certain desktop workstation designs, it is common to mount relatively large numbers of memory modules on "riser" boards (daughter boards which extend in a vertical plane relative to the motherboard) which are then affixed to the motherboard via printed circuit board connectors. The inventors have found that when such desktop workstations designs are implemented, the Connector Specification printed circuit board connectors are unable to adequately support the mechanical stresses associated with the rise cards, and tend to give rise to signal integrity and reliability problems owing to either the breaking or flexing of the Connector Specification printed circuit board connectors under the mechanical strain produced by the riser card.

In an effort to solve the foregoing noted problems, the inventors have tried to replace the Connector Specification printed circuit board connectors with more physically sturdy non-Connector Specification printed circuit board connectors (e.g., PCI specification connectors). In so doing, the inventors, using conventional circuit design techniques, concluded that even though the non-Connector Specification connectors did not match the 28 ohm impedance of the transmission lines of RAMBUS memory modules used in the Connector Specification, there would still be enough power transferred such that the loss of efficiency arising from the mismatched impedances would be outweighed by the increased accuracy arising from the superior mechanical strengths of the non-Connector Specification printed circuit board connectors.

Unfortunately, and unexpectedly, the inventors have found that when the non-Connector Specification connectors are implemented in RAMBUS systems, the performance of the RAMBUS memory modules becomes severely unacceptable. That is, the inventors have found that when the non-Connector Specification printed circuit board connectors are actually implemented in conjunction with RAMBUS memory modules, the errors associated with such modules are far below acceptable limits.

Insofar as conventional printed circuit board design techniques indicate that the mismatched impedance components should work together in an acceptable manner, the failure of the components to work together has given rise to a need for the inventors (1) to determine why the unacceptable errors are occurring, and, (2) if the cause of the unacceptable errors can be determined, to provide a method and system which will provide the ability to implement the non-Connector Specification connectors in RAMBUS systems in such a fashion that the performance of the systems is acceptable.

SUMMARY OF THE INVENTION

The inventors named herein have discovered at least one method and at least one related computer system that allow mismatched impedance data processing system components to be implemented such that the mismatched impedance data processing system components provide acceptable service in a data processing system. In one embodiment, the method includes but is not limited to exciting a printed circuit board circuit having mismatched impedance printed circuit board components, measuring at least one impedance of the circuit with a time domain reflectometer, and adjusting at least one printed circuit board circuit element, in response to the measured at least one impedance of the circuit. In one embodiment, the related computer system includes but is not limited to one or more printed circuit boards having at least one circuit wherein reside substantially mismatched impedance printed circuit board components, an impedance-variation equalizing distribution of at least one printed circuit board element operably coupled with the substantially mismatched impedance printed circuit board components, and said one or more printed circuit boards operably connecting at least one processor and at least one memory.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIGS. 1A through 1F show a high-level logic flowchart depicting a process to be utilized to substantially minimize error arising from reflected electromagnetic energy when implementing mismatched impedance data processing system printed circuit board components operating at high speeds and relatively low voltages.

FIGS. 6A and 6B depict motherboard 202 having selected components of data processing system 520 in which Double Density PCI socket 200 and PCI board edge connector 250, modified as described in relation to FIGS. 1A–1F, 3 and 4, may be implemented.

The use of the same reference symbols in different drawings indicates similar or identical items.

DESCRIPTION OF THE PREFERRED EMBODIMENT(S)

Figure 1D:
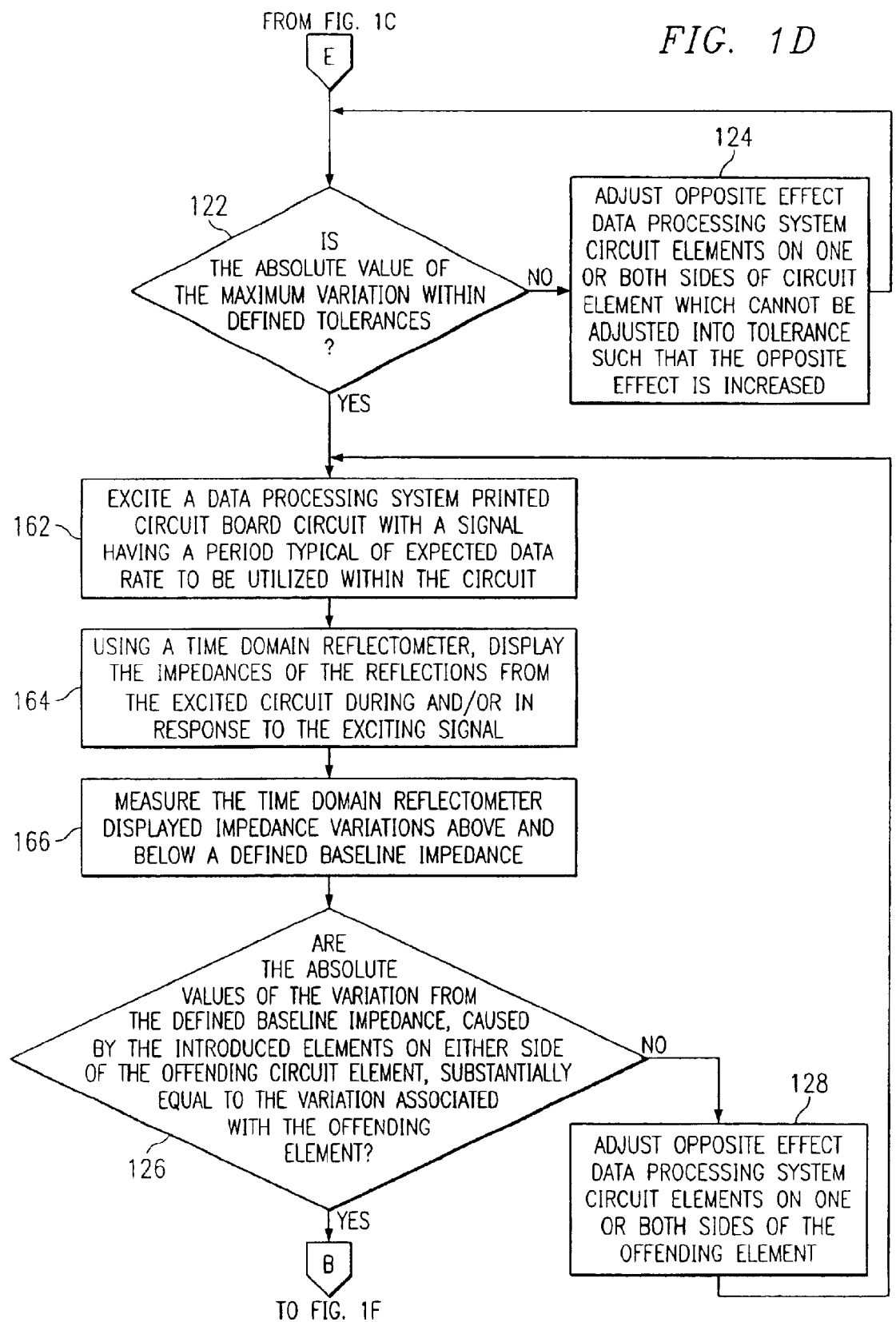
Figure 1F:
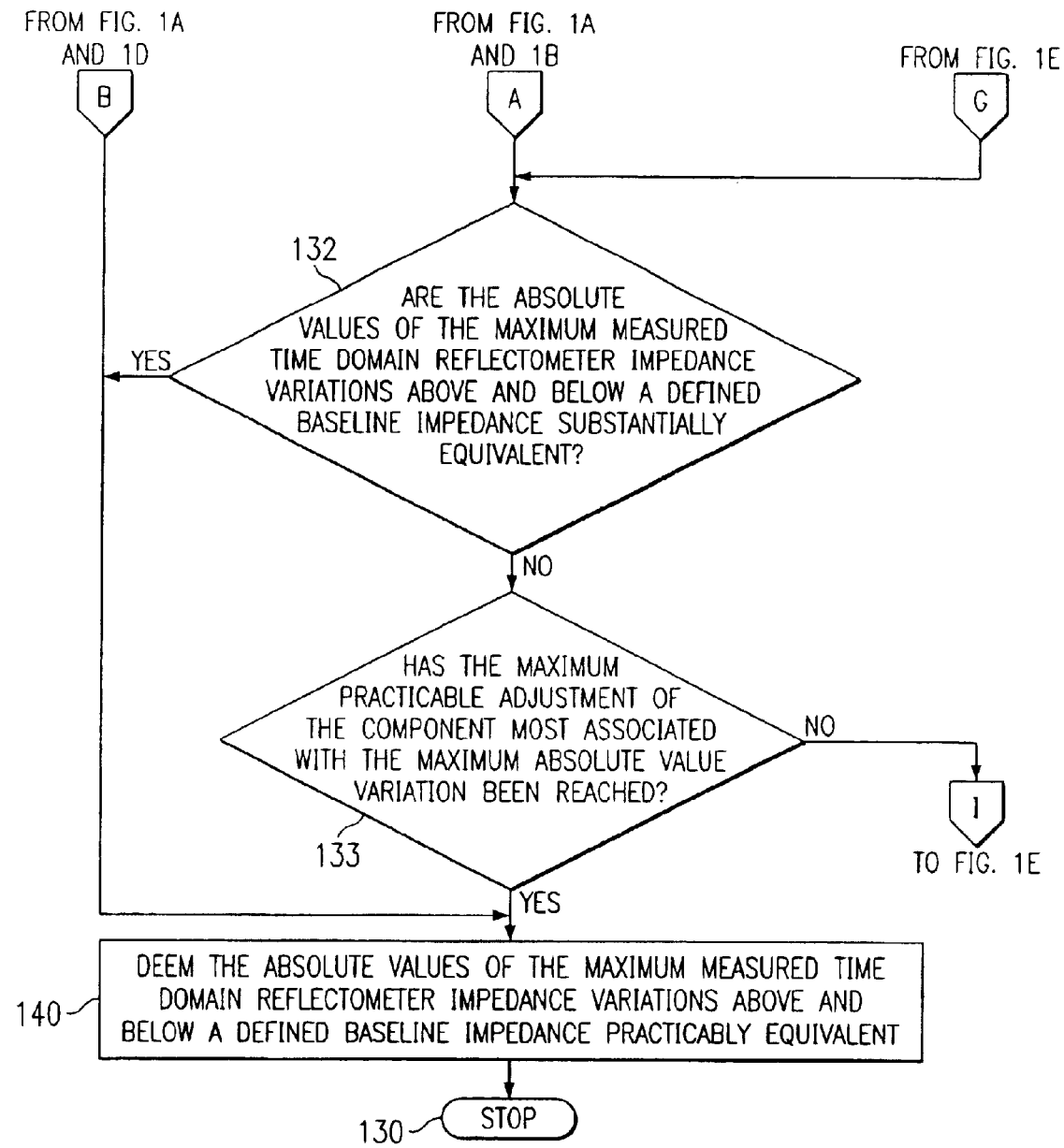

The following sets forth a detailed description of the best contemplated mode for carrying out the independent invention(s) described herein. The description is intended to be illustrative and should not be taken to be limiting.

As was noted in the description of the related art section, the inventors have discovered that the non-Connector Specification printed circuit board connectors do not function within tolerances when implemented within an actual system. Accordingly, as was also noted in the related art section, it has fallen to the inventors to determine the reason(s) why the non-Connector Specification printed circuit board connectors do not function within tolerances, and, if possible, to invent a solution which will allow the non-Connector Specification printed circuit board connectors to function within the system.

The inventors have discovered at least a few of the reasons why the non-Connector Specification printed circuit board connectors do not function acceptably within RAMBUS systems. The inventors have also devised a solution, presented herein, which will allow the non-Connector Specification printed circuit board connectors to function acceptably within RAMBUS systems. In addition, this solution, while presented herein in the context of RAMBUS memory modules, has general applicability to virtually any data processing system where mismatched impedance printed circuit board components fail to function within design tolerances when implemented.

The inventors have discovered that one reason why non-Connector Specification printed circuit board connectors do not function as expected is that the high speeds of modern microprocessors, combined with the mismatched impedance of the printed circuit board components, further combined with the reduced operating voltage of the RAMBUS memory modules, make the conventional printed circuit board design techniques originally utilized by the inventors inappropriate (memory modules designed under the de facto standard typically use a signal ranging between 0 and +5 volts to respectively indicate logical zero and logical one values; RAMBUS memory modules use a signal ranging between 0 and +1 volts to respectively indicate logical zero and logical one values). That is, as described above, in deciding to use the non-Connector Specification printed circuit board connectors, the inventors utilized conventional logic and circuit design techniques when designing the data processing system, but the inventors have discovered that such conventional design techniques are inappropriate for implementing mismatched impedance data processing system components operating at high speeds and relatively low voltages.

The inventors have discovered that when implementing mismatched impedance data processing system components operating at high speeds and relatively low voltages, special attention must be paid to reflected energy within the system, which is something completely neglected in the classical circuit theory conventionally utilized in data processing system design. The inventors have discovered that at least one of the reasons why the non-Connector Specification printed circuit board connectors do not function as predicted by the conventional design techniques is that electrical energy reflected from the mismatched data processing system components is severe enough that the reflected energy creates voltages sufficient to create false changes in RAMBUS signals. For example, if the true signal on a printed circuit board trace is sufficiently close to 0 volts to indicate a logical 0 under the RAMBUS standard, it has been discovered by the inventors that sometimes reflected energy within the circuit is severe enough such that voltage on the printed circuit board trace moves sufficiently close to +1 volt to "trick" the data processing system components into thinking that a logical 1 is on the trace, which can result in a processing error. Likewise, it has been discovered by the inventors that even though the true signal on the printed circuit board trace is of a voltage close enough to +1 volts to signal a logical 1 under the RAMBUS standard, sometimes reflected energy within the circuit is severe enough such that voltage on the printed circuit board trace moves sufficiently close to 0 volts to "trick" the data processing system components into thinking that a logical 0 is on the bus, which likewise results in a processing error.

Having discovered the foregoing, the inventors posited that they needed a process which would allow them to create a related device which would substantially minimize the type of reflected energy fluctuations, arising from the mismatched impedance components, which can give rise to the described processing errors. The inventors have devised a scheme to achieve this by utilization of a time domain reflectometer (e.g., a Tektronix Model 11801C Time Domain Reflectometer).

A time domain reflectometer is a device which excites an electrical circuit with an electrical signal, and then utilizes reflected electrical energy to display a characteristic impedance, as a function of time, experienced by the electrical signal as it transits the excited circuit. The inventors have recognized that the time domain reflectometer would not allow them to detect the reflected electrical energy directly, but the inventors have surmised that they could empirically determine exactly what type of impedance variation from a defined impedance baseline displayed on that time domain reflectometer would equate to unacceptable reflected energy, and then utilize that empirically determined impedance variation to serve as a "tolerance" for acceptable circuit design. For example, for RAMBUS systems, the inventors have found by using the time domain reflectometer to test various printed circuits—each with circuit tested having differing impedance variations—that impedance variations of plus or minus 3 ohms about a 28 ohm baseline would keep the reflected energy within acceptable limits (i.e., would get eliminate the unacceptable processing errors). Using such an empirically determined baseline, the inventors have been able to modify non-Connector Specification printed circuit board connectors to achieve acceptable performance within RAMBUS systems via a process which will now be described.

With reference to the figures, and in the particular with reference now to FIG. 1A through 1F, shown is a high-level logic flowchart depicting a process to be utilized to substantially minimize error arising from reflected electromagnetic energy when implementing mismatched impedance data processing system printed circuit board components operating at high speeds and relatively low voltages. Method step 100 illustrates the start of the process. Method step 102 shows the excitation of a data-processing system printed circuit board circuit having circuit elements of mismatched impedances (e.g., a PCI specification printed circuit board connector implemented within a Connector Specification system, as discussed above) with a signal typical of that to be utilized within the data-processing system. Method step 104 depicts using a time domain reflectometer to display the impedance values encountered at different points in time by the exciting signal as it transits along the length of the excited circuit; the time domain reflectometer calculates the impedance encountered by the signal utilizing reflected voltage values in conjunction with the known impedances associated with the probe apparatuses (typically sending and receiving pieces of coaxial cable, each piece of cable having an attached connector (termed a "probe" on the sending piece, and a "return connector" on the return piece) allowing connection to the data-processing system circuit to be excited) time domain reflectometer and the known speed of electrical energy within the coaxial cables and data-processing system circuit elements in order to calculate the impedance encountered at each instant in time (the display shows impedance in ohms on the x-axis and time on the y-axis) by the electrical energy as it moves through the excited circuit.

It has been discovered by the inventors that certain printed circuit board elements will have a reflection that indicates a tendency of those elements to "sink" (or absorb) electrical energy, where such a sinking appears to the time domain reflectometer as an impedance below that of a defined baseline impedance at any particular point in time. (Such elements actually cause a negative reflection of energy.) Due to the superficial similarity of this phenomenon with the action of a capacitor in traditional circuit theory (in traditional circuit theory, a capacitor is initially viewed as a short circuit, so it at least initially has zero potential associated with it and thus will sink energy), such phenomenon will be referred to herein as a "capacitive effect." It has also been discovered by the inventors that certain other of the printed circuit board circuit elements will restrict, or choke the transmission of electrical energy through them, where such restriction appears on a time domain reflectometer as an impedance above that of the defined baseline impedance at any particular point in time. (Such elements actually cause a positive reflection of energy.) Due to the superficial similarity of this phenomenon (increased impedance on the time domain reflectometer upon encountering the circuit element) with the action of an inductor in traditional circuit theory (in traditional circuit theory, and inductor is use as initially "choking off," or blocking electrical current through the inductor), such phenomenon will be referred to herein as "inductive effect."

Method step 106 depicts measuring impedance variations, displayed by the time domain reflectometer, above and below a defined baseline impedance value. (While the discussion herein will describe impedance variations due to the use of the time domain reflectometer, it is to be kept in mind that what is actually of interest are reflected energy variations.) Method step 108 illustrates the determination of (a) whether the largest magnitude (i.e., absolute value)

impedance variations above and below the defined impedance value are substantially equivalent (what is considered substantially equivalent is a design choice within the purview of the data-processing system designer; however, in one implementation substantially equivalent is defined to be such that the largest magnitude variation below the defined baseline impedance value and the largest magnitude variation above the defined baseline impedance value are within 20 percent of each other (i.e., the absolute value of the smaller variation is at least 80 percent of the larger variation)), and (b) whether both the largest magnitude variation below the defined baseline impedance value and the largest magnitude variation above the defined baseline impedance value are within specified design tolerances (the way to determine what is considered within specified design tolerance was described above, and is dependent upon the circuits and components; however, in the RAMBUS system oriented embodiment described in relation to FIGS. 3 and 4, below, the tolerance is defined to be plus or minus three ohms from a defined baseline impedance of 28 ohms). If the inquiry described in relation to method step 108 yields a determination that the largest magnitude variations are substantially equivalent and are within maximum variation tolerances, illustrated is that the process proceeds to method step 140 and continues from that point.

Figure 3:
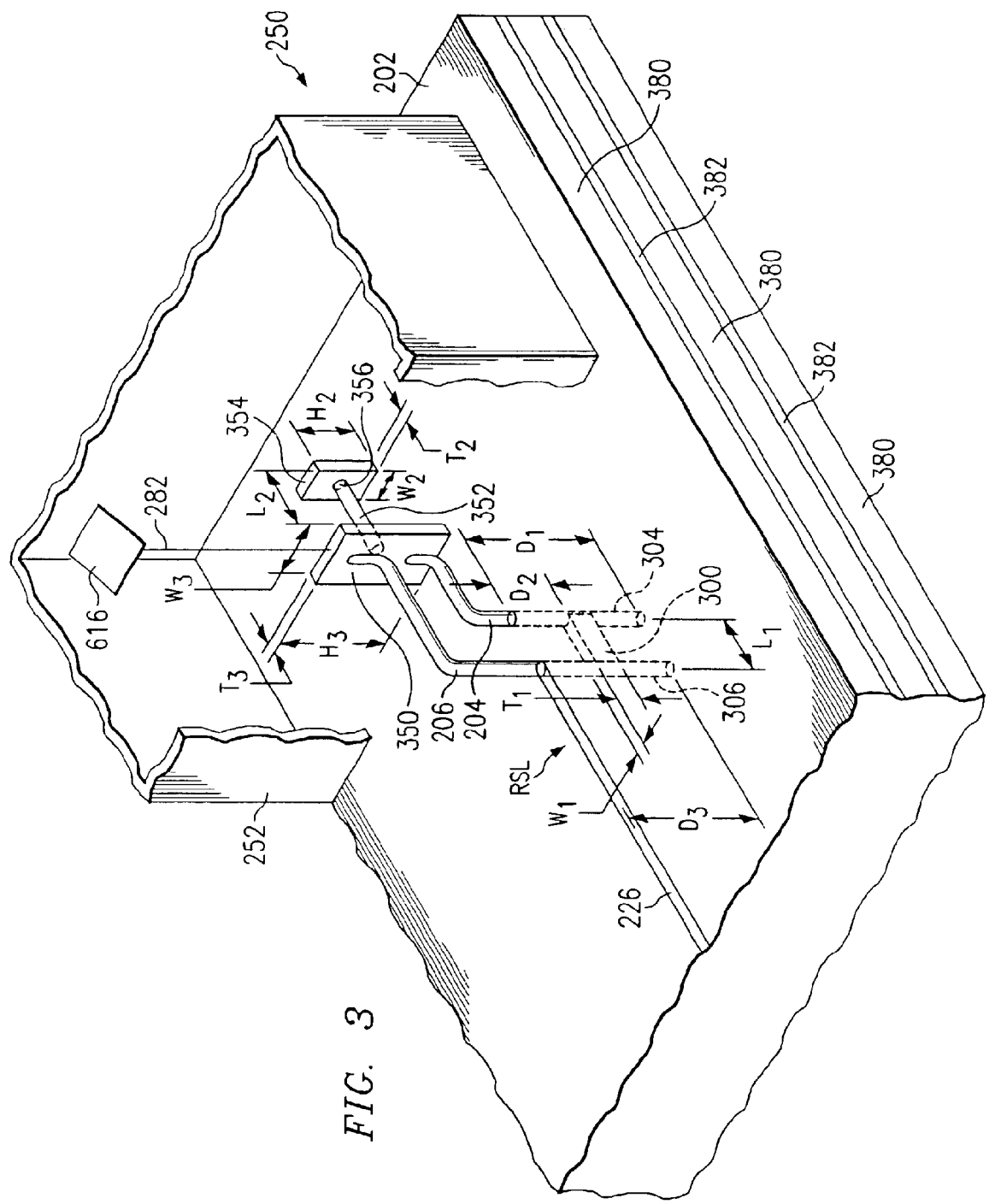
FIG. 3 shows a Double Density PCI board edge connector 250, and motherboard 202, both of which are depicted with circuit modifications devised by the inventors which adapt Double Density PCI socket 200 and Double Density PCI board edge connector 250 such that they function in RAMBUS environments with acceptable rates of error.
Figure 4:
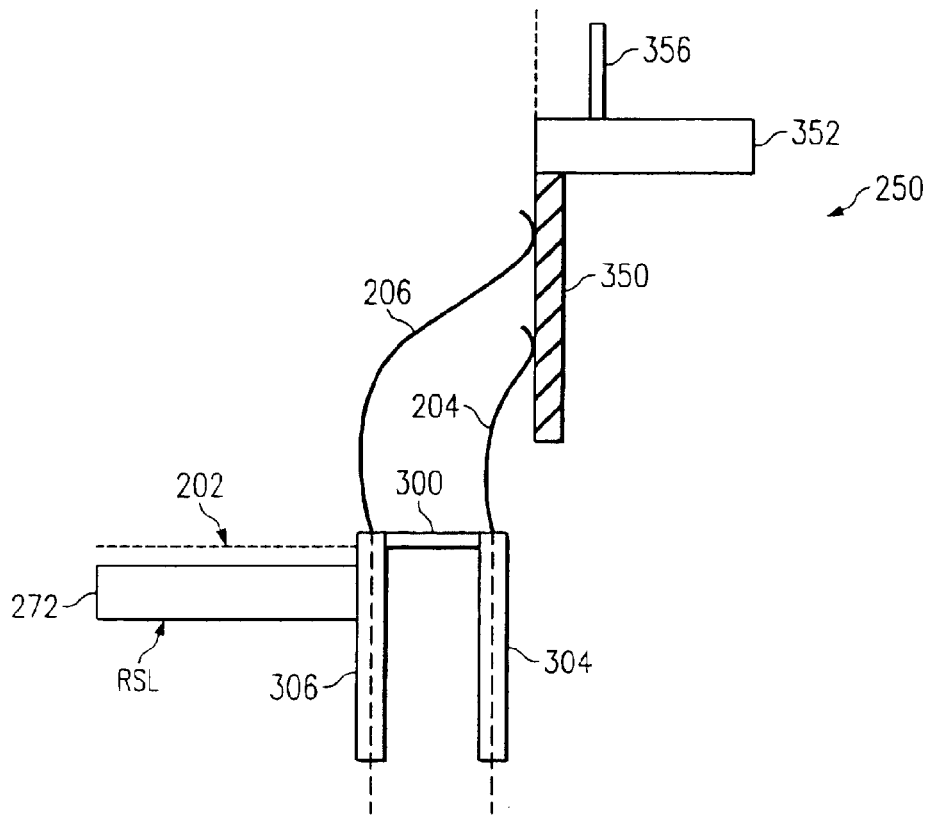
FIG. 4 shows a partial plan view of Double Density PCI board edge connector 250 and motherboard 202 with circuit modifications similar to those shown in FIG. 3, but with the printed circuit board elements arranged in slightly different positions than those shown in FIG. 3.

If the inquiry described in relation to method step 108 yields a determination either that the largest magnitude variations are not substantially equivalent or that the maximum magnitude variations are not within defined tolerances, the process proceeds to method step 112 which depicts the inquiry as to whether the absolute value of the maximum variation is within defined to tolerance (e.g., +/−3 ohms from a 28 ohm defined baseline impedance for the circuit described in relation to FIGS. 3 and 4). If the inquiry depicted in method step 112 yields a determination that the maximum magnitude variation is not within the defined tolerance value, the process proceeds to method step 114 which depicts that the printed circuit board component most associated with out-of-tolerance variation is adjusted in effort to bring the variation within tolerance. For example, if the out-of-tolerance variation is a swing above the defined baseline impedance, it may be inferred that the reflected voltage at the location associated with the swing above the defined baseline impedance increased and thus it may be further inferred that the printed circuit were element at the location of the impedance swing is producing an excessive inductive effect. Consequently, printed circuit board elements may be added to the printed circuit board element such that two or more inductive elements are connected in parallel, whereby the inductive effect is lessened thereby reducing the impedance swing above the defined baseline. For example, in the circuit depicted in FIGS. 3 and 4, connector wipers 204 and 206 are connected in parallel by shorting strap 300 in order to reduce the inductive effect associated with those portions of connector wipers 204 and 206 exposed to air (i.e., not in contact with either vias 304 or 306, respectively.

Those skilled in the art will recognize that locating the component most responsible for an out-of-tolerance impedance variation will itself many times involve an iterative process in which each differentiable component in the circuit under test is sequentially tested until the individual component most associated with the out-of-tolerance variation is located. For example, the probe of the time domain reflectometer is attached to the circuit under test, and thereafter the connector on the return piece of coaxial cable is moved sequentially through the circuit, on an element by element basis, until the out-of-tolerance impedance variation appears on the time domain reflectometer, in which case the printed circuit board element between the probe and return connector, and immediately adjacent to the return connector, is presumed to be the printed circuit board element most associated with the out-of-tolerance variation. Another way to locate the circuit element most associated with the out-of-tolerance variation is to use the time domain reflectometer display in conjunction with the known speed of the electrical energy through the circuit to localize the likely position of the printed circuit board element giving rise to the out-of-tolerance variation. Since on a time domain reflectometer display the position of the signal on the time domain reflectometer is correlated with time the speed of the electrical energy in the printed circuit board circuit can be used to work backwards to the likely distance into the circuit that the printed circuit board element giving rise to the out-of-tolerance variation is located.

For example, the speed of electrical energy in a copper trace on an outer layer of a fiberglass-epoxy printed circuit board can be roughly calculated to be approximately 1/(145 pico-seconds per inch), and the speed of electrical energy in a copper trace on an inner layer of a fiberglass-epoxy printed circuit board can be roughly calculated to be approximately 1/(180 pico-seconds per inch) for inner layer traces using the following formula:

Speed=1/((84.7 pico seconds per inch)*(square root of the effective relative dielectric constant)).

The term "effective dielectric constant" is an indication that taken into account is that since an outer layer copper trace is exposed to both air (with a relative dielectric constant of 1.0) and the fiberglass-epoxy printed circuit board (with a relative dielectric constant of about 4.0), the effective dielectric constant to which the copper trace is subject, will turn out to be some value between 1.0 (for the air) and 4.0 (for the board). For example, for a copper trace on the outer layer of an fiberglass-epoxy printed circuit board, the effective dielectric constant turns out to be somewhere around 3.2. This effective dielectric constant is calculated by weighting the electrical energy in air (with a relative dielectric constant of 1.0) and in the printed circuit board (with a relative dielectric constant of about 4.0). In practice, this is determined by software known as a "2D Field Solver," which is a package which uses numerical techniques to calculate a 2-dimensional electric field for a given trace geometry (a commercially available 2D Field Solver is Apsim RLGC, available from Applied Simulation Technology in San Jose, Calif.). However, for inner layer traces, the effective dielectric constant is that of the surrounding material (e.g., around 4.0 for a fiberglass-epoxy printed circuit board), since the inner layer printed circuit board traces are completely surrounded by dielectric material.

Subsequent to method step 114, illustrated is that the process proceeds through method steps 142, 144, and 146, which respectively function in the same fashion as method steps 102, 104, and 106 as described previously. Method step 116 depicts the inquiry as to whether, subsequent to adjustment, the maximum magnitude of variation is within tolerance. If the inquiry depicted in method step 116 yields a determination that the maximum of magnitude variation is not within tolerance, illustrated is that the process proceeds to method step 118 wherein is shown the inquiry as to whether maximum practicable adjustment of the data-processing system component most associated with the out-of-tolerance variation has been reached (e.g. no further reduction in the inductive effect can practicably be achieved by varying the element most responsible for the inductive effect). The term "maximum practicable adjustment" takes into account that while electrically it may be possible to provide more adjustment (e.g., by connecting a third connector wiper in parallel with the two connector wipers 204 and 206 to further reduce the inductive effects of the connector wipers), practicable design constraints (lack of printed circuit board real estate or EMI concerns, for example), may make such choices impracticable, in which case the maximum practicable adjustment of the printed circuit board element most responsible for the out-of-tolerance variation will have been reached.

If the inquiry described in relation method step 118 indicates that maximum practicable adjustment of the circuit element has not been achieved, shown is that the process proceeds to method step 114 and continues from that point. If the inquiry described in relation to method step 118 indicates that maximum practicable adjustment of the circuit element most associated the out of tolerance variation (such circuit element being referred to hereafter as "the offending element") has been reached, the process proceeds to method step 120 wherein is depicted that "opposite reflected energy effect" printed circuit board elements are introduced on one or both sides of the offending element which cannot be adjusted into tolerance. For example, for the circuit depicted in FIGS. 3 and 4, connector wipers 204 and 206 connected in parallel still result in an out-of-tolerance variation and it is not practicable to connect yet a third connector wiper with connector wipers 204 and 206. Since on a time domain reflectometer, connector wipers 204 and 206 connected in parallel result in an impedance variation in excess of 3 ohms above the defined 28 ohm defined baseline impedance, the capacitive effect elements are introduced electrically adjacent to connector wipers 204 and 206. One such capacitive effect is introduced by the portions, between the surface of motherboard 202 and the top surface of shorting strap 300, of connector wipers 204 and 206 in respective electrical connections with vias 304 and 306 (e.g., the portions of connector wipers 204 and 206 in respective electrical connections with vias 304 and 306, such portions having length equal to $D_1$), and another capacitive effect is collectively introduced by one-piece fingerpad 350, conductive via 352, and compensation pad 354.

Thereafter, the process proceeds through method steps 152, 154, and 156, which respectively function in the same fashion as method steps 102, 104, and 106 as described previously. Subsequently, the process proceeds to method step 122 wherein is depicted the inquiry as to whether the magnitude of the impedance variation associated with the offending element has been brought within tolerance. If the inquiry depicted in method step 122 yields a determination that the impedance variation of the offending element has not been brought within tolerance, the process proceeds to method step 124 wherein it is shown that the "opposite reflected energy effect" printed circuit board circuit elements discussed in relation to method step 120 are adjusted such that the maximum variation is drawn toward tolerance the acceptable tolerance value. For example, in the circuit described in relation to FIGS. 3 and 4, the depth $D_1$ can be increased to increase the capacitive effect associated with connector wipers 204 and 206 in respective electrical connections with vias 304 and 306, and substantially any of the dimensions of fingerpad 350, via 352, and compensation pad 354 can be increased to give rise to a greater capacitive effect collectively associated with fingerpad 350, via 352, and compensation pad 354 such that the capacitive effects or either side of the inductive element (collectively the portions of connector wipers 204 and 206 exposed to air) are increased thereby bringing the maximum variation of the inductive effect element closer to the defined baseline impedance value of 28 ohms, and thus nearer to defined tolerance.

If the inquiry depicted in method step 122 yields a determination that the impedance variation of the offending element is within tolerance, the process proceeds to method steps 162, 164, and 166, which respectively function in the same fashion as method steps 102, 104, and 106 as described previously. Thereafter, the process proceeds to method step 126 which depicts the inquiry as to whether the absolute value variations of either side of the offending element are substantially less than (e.g., less than 80%) of the absolute value of the variation associated with the offending element. In the event that the inquiry depicted in relation to method step 126 yields a determination that the absolute value impedance variations on either side of the offending element are substantially equal to the absolute value impedance variation associated with the offending element, the process proceeds to method step 128 wherein it is shown that any "opposite reflected energy effect" printed circuit board circuit elements such as discussed in relation to method step 120 are adjusted such that the "opposite effect" is increased, which produces the dual effects of moving the variations above and below the defined impedance baseline towards each other and moving the maximum impedance variation closer toward tolerance (i.e., toward the defined baseline impedance). For example, if capacitive effect elements were introduced on either side of an offending inductive effect element, the physical geometries of the capacitive effect elements would be adjusted such that the capacitive effects on either side of the inductive element were increased, thereby bringing the maximum variation of the inductive effect element closer to the defined baseline impedance value and thus into better tolerance. The foregoing described method step substantially optimizes the in that after tolerance has been achieved, the method step essentially adjusts the elements such that both the variations above and below the baseline are substantially equal. Thereafter, the process proceeds to method step 162 and proceeds from that point.

In the event that the inquiry depicted in relation to method step 126 yields a determination that the absolute value impedance variations of the elements one either side of the offending element are substantially equal to the absolute value variation associated with the offending element, the process proceeds to method step 140 and continues from that point.

If the inquiry depicted in method step 116 yields a determination that the maximum magnitude impedance variation is within tolerance, illustrated is that the process proceeds to method step 132 which shows an inquiry as to whether the absolute values of the maximum measured time domain reflectometer impedance variations above and below the defined baseline impedance are substantially equivalent (e.g., within 20% of each other). In the event that the inquiry depicted in relation to method step 132 yields a determination that the absolute values of the maximum measured time domain reflectometer impedance variations above and below the defined baseline impedance are substantially equivalent, the process proceeds to method step 140 wherein it is shown that the impedance variations are deemed practicably equivalent. Thereafter, the process proceeds to method step 130 and stops.

In the event that the inquiry depicted in relation to method step 132 yields a determination that the absolute values of the maximum measured time domain reflectometer impedance variations above and below the defined baseline impedance are not substantially equivalent, the process proceeds to method step 133, wherein is shown the inquiry as to whether wherein is shown the inquiry as to whether maximum practicable adjustment of the data-processing system component most associated with the maximum impedance variation considered in method step 132 has been reached. If the inquiry depicted in method step 133 yields a determination that maximum practicable adjustment has not been reached, shown is that the process proceeds to method step 134 wherein is depicted that the electrical characteristics (e.g., the physical geometry) of the printed circuit board element most associated with the maximum absolute value variation is adjusted such that the absolute values of the maximum measured time domain reflectometer impedance variations above and below the defined baseline moves toward becoming substantially equivalent; that is, the printed circuit board element giving rise to the largest absolute value variation (which may be associated with either a swing above or below the defined impedance baseline) Thereafter, and the process proceeds through method steps 172, 174, and 176, which respectively function in the same fashion as method steps 102, 104, and 106 as described previously.

If the inquiry depicted in method step 133 yields a determination that maximum practicable adjustment has been reached, the process proceeds to method step 140 wherein it is shown that the impedance variations are deemed practicably equivalent. Thereafter, the process proceeds to method step 130 and stops.

The foregoing process can be utilized to adapt mismatched impedance printed circuit board components such that the mismatched impedance printed circuit board components can function in an acceptable matter within a data-processing system. Those skilled in art will recognize that the foregoing process may be employed repetitively for each printed circuit board circuit element yielding out of tolerance impedance variation values.

Figure 2A:
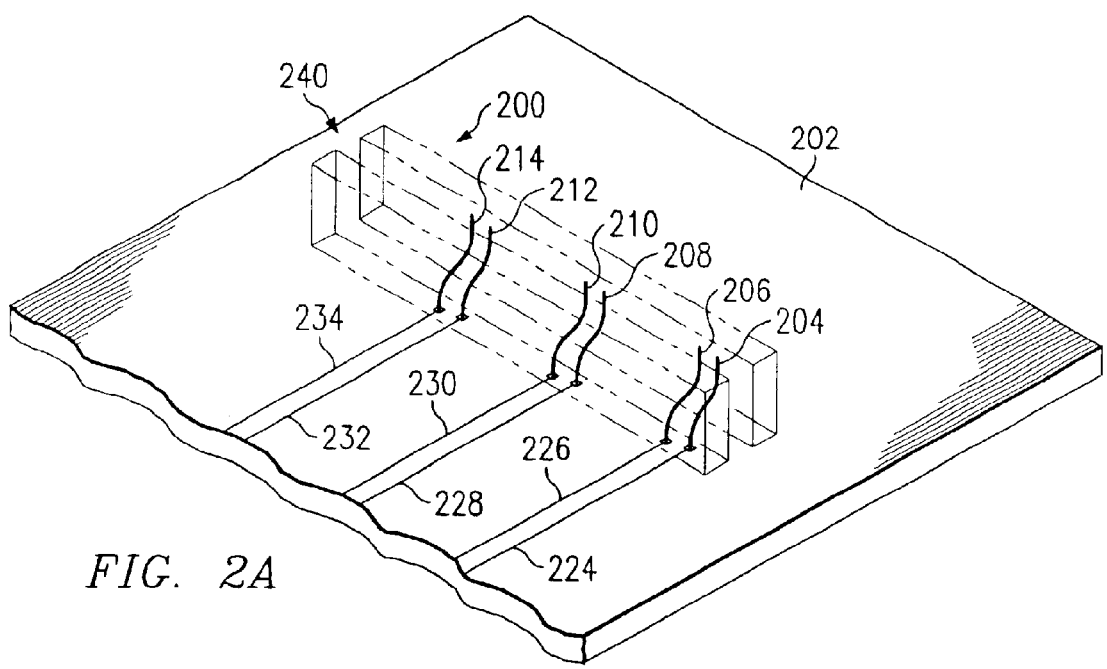
FIG. 2A and FIG. 2B, respectively depict partial views of related-art Double Density PCI socket 200 and rise card 245 having system memory 616, with the surface 252 of riser card 245 having conventional fingerpads adapted to function with Double Density PCI socket 200.
Figure 2B:
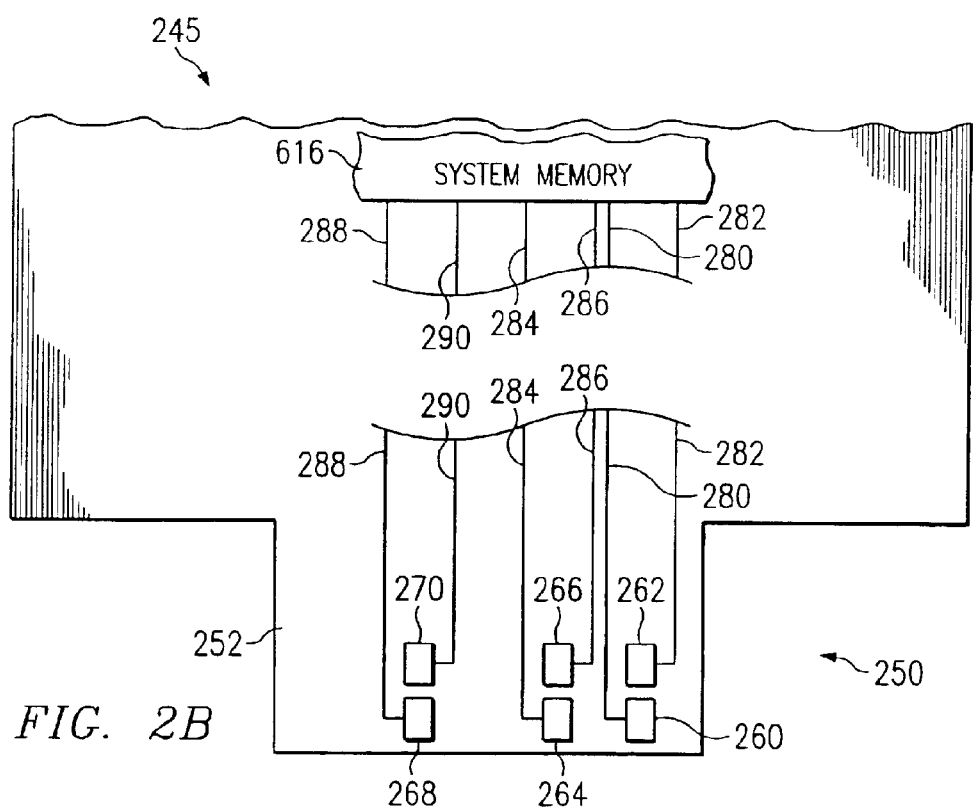

Referring now to FIG. 2A and FIG. 2B, respectively depicted are partial views of related-art Double Density PCI socket 200 and riser card 245 having system memory 616, with the surface 252 of riser card 245 having conventional fingerpads adapted to function with Double Density PCI socket 200. With reference now to FIG 2A, illustrated is Double Density PCI socket 200 mounted on motherboard 202. Double Density PCI socket 200 is shown in transparent view such that connector wipers 204–214 can be seen. Depicted is that each connector wiper 204–214 respectively articulates with each printed circuit board trace 224–234 (a "trace" is typically a thin layer of copper deposited on the surface of motherboard 202). Illustrated is that each printed circuit board trace 224–234 articulates with system memory 616.

Referring now to FIG. 2B, illustrated is a partial plan view of riser card 245. Riser card 245 is essentially a printed circuit board to be mounted in a vertical plane relative to motherboard 202. In conventional practice, one edge of riser card 245 is formed such that it may be inserted edgewise into PCI double density socket 200, and fingerpads 260–270 are deployed upon the surface 252 of riser card 245 such that when riser card 245 is inserted edgewise into slot 240, each fingerpad 260–270 respectively articulates with each connector wiper 204–214. Accordingly, a printed circuit board edge formed and functioning as described and shown is herein referred to as PCI board edge connector 250. Further shown is that each fingerpad 260–270 respectively articulates with riser card 245 connector traces 280–290 which generally are connected to some type of printed circuit board component, such as system memory 616 (a "trace" is typically a thin layer of copper deposit on the surface of rise card 245). Those skilled in the art will recognize that in practice Double Density PCI socket 200 and Double Density PCI board edge connector 250 will have many more connector wipers and fingerpads than are shown in FIG. 2A and FIG. 2B.

Double Density PCI socket 200 and Double Density PCI board edge connector 250 are manufactured such that they are in compliance with the de facto standard (60 ohm Thevenin equivalence) described in the related art section above. It has been discovered by the inventors that the process described in relation to FIG. 1 can be utilized to adapt the Double Density PCI socket 200 and Double Density PCI board edge connector 250 to function in RAMBUS system environments with acceptable rates of error.

With reference now to FIG. 3, shown in perspective view are Double Density PCI board edge connector 250, and motherboard 202, both of which are depicted with circuit modifications devised by the inventors which adapt Double Density PCI socket 200 and Double Density PCI board edge connector 250 such that they function in RAMBUS system environments with acceptable rates of error. Depicted are connector wipers 204 and 206 of Double Density PCI socket 200 (the details of Double Density PCI socket 200 have been omitted for sake of clarity, but it is to be understood that connector wipers 204 and 206 are contained within Double Density PCI socket 200 as shown in FIG. 2A). Motherboard 202 is shown having alternating layers of non-conductive material 380 and conductive material 382.

The first modification shown is that whereas in FIG. 2A connector wiper 204 and connector wiper 206 were shown respectively connected with printed circuit board trace 224 and 226, in FIG. 3 connector wiper 206 is not shown connected with printed circuit board trace 226, but is rather shown in electrical connection with via 304, which is shown in electrical connection with metallic shorting strap 300 which is shown in electrical connection with via 306, which is shown in electrical connection with connector wiper 204. Additionally shown is that via 306 is in electrical connection with printed circuit board trace 226.

The second modification shown is that whereas in FIG. 2B to fingerpads 260 and 262 are described as respectively articulating with connector wipers 204 and 206, and FIG. 3 connector wipers 204 and 206 are shown articulating with one-piece fingerpad 350. The third modification shown is that compensation pad 354 is deployed within the interior of PCI Double Density board edge connector 250. The fourth modification shown is that one-piece fingerpad 350 and a compensation pad 354 are electrically connected by via 352.

Shown is that shorting strap 300 has an associated width, $W_1$, and an associated thickness, $T_1$, and an associated depth, $D_2$, relative to the surface of motherboard 202, and an associated length, $L_1$. Depicted is that via 306 has an associated depth, $D_3$, relative to the surface of motherboard 202, and that via 304 has an associated depth, $D_1$, relative to the surface of motherboard 202.

Illustrated is that one-piece fingerpad 350 has an associated width, $W_3$, and an associated thickness, $T_3$, and an associated height, $H_3$. Shown is that via 352 has an associated length, $L_3$, and diameter 356. Depicted is that compensation pad 354 has an associated width, $W_2$, an associated height, $H_2$, and an associated thickness, $T_2$.

The printed circuit board structures depicted in FIG. 3 can be utilized in conjunction with the process described in relation to FIG. 1 to adapt the Double Density PCI socket 200 and Double Density PCI board edge connector 250 to function in RAMBUS system environments. It has been discovered by the inventors herein that the portions of connector wipers 206 and 204, in respective electrical connection with vias 306 and 304, produce substantially capacitive effects. It has also been discovered by the inventors that one-piece fingerpad 350, via 352, and compensation pad 354 produce substantially capacitive effects. It has also been discovered by the inventors that the portions of connector wipers 206 and 204 which are neither in contact with a via or one-piece fingerpad 350 (i.e., those portions of connector wipers 206 and 204 depicted as exposed to the air) produce substantially inductive effects. It has also been discovered that shorting strap 300 produces mainly resistive effect and relatively little inductive or capacitive effect.

It has been empirically discovered by the inventors that varying the depth, $D_2$, of the shorting strap 300 can be used to adjust the capacitive effect associated with the portion of connector wiper 206 in electrical articulation with via 306. It has further been discovered that varying the width, $W_1$, of shorting strap 300 can be used to vary the capacitive and inductive loading effects respectively associated with the portion of connector wiper 204 in electrical articulation with via 304 and the portion of connector wipers 204 exposed to air. It has further been discovered by the inventors that the parameters associated with one-piece fingerpad 350, conductive via 352, and compensation pad 354 can be varied in order to affect the capacitive effects collectively associated with those structures. Using the foregoing empirically determined characteristics of the printed circuit board structures in conjunction with the process described in relation to FIG. 1, the structures can be repetitively varied until a circuit containing Double Density PCI socket 200 and Double Density PCI board edge connector 250 has impedance variations of plus or minus 3 ohms from a defined impedance baseline of 28 ohms throughout the entire circuit.

In one embodiment, the use of the process described in relation to FIG. 1 with the circuit shown in FIG. 3 resulted in a circuit whose structures had the following parameters: $L_2$=4.5 mils, $L_1$=100 mils, $D_1$=$D_3$=62.4 mils, $D_2$=0 mils, $W_1$=5 mils, $H_3$=423 mils, $W_3$=40 mils, $H_2$=0 mils, $W_2$=0 mils, $T_1$=2.2 mils, $T_2$=1.2 mils, $T_3$=2.2 mils. These parameters have allowed the Double Density PCI socket 200 and the Double Density PCI board edge connector to be effectively used with RAMBUS components.

FIG. 4 shows a partial plan view of Double Density PCI board edge connector 250 and motherboard 202 with circuit modifications similar to those shown in FIG. 3, but with the printed circuit board elements arranged in slightly different positions than those shown in FIG. 3.

Figure 5:
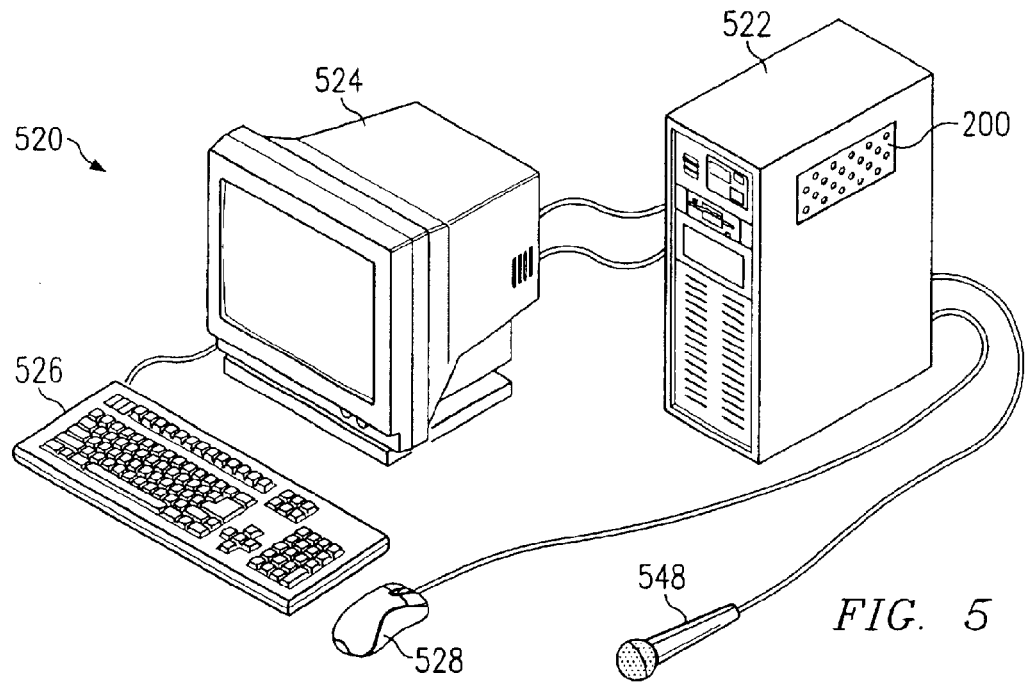
FIG. 5 depicts a pictorial representation of a conventional data processing system which can be utilized in accordance with the device(s) and/or process(es) described herein.

With reference now to FIG. 5, depicted is a pictorial representation of a conventional data processing system which can be utilized in accordance with the device(s) and/or process(es) described herein. Data processing system 520 is depicted which includes system unit housing 522, video display device 524, keyboard 526, mouse 528, and microphone 548. A graphical user interface system and method can be implemented with the data processing system depicted in FIG. 5. Data processing system 520 may be implemented utilizing any suitable computer such as a DELL Optiplex GX1 computer, a product of Dell Computer Corporation, located in Round Rock, Tex.; Optiplex GX1 is a trademark of Dell Computer Corporation.

Figure 6A:
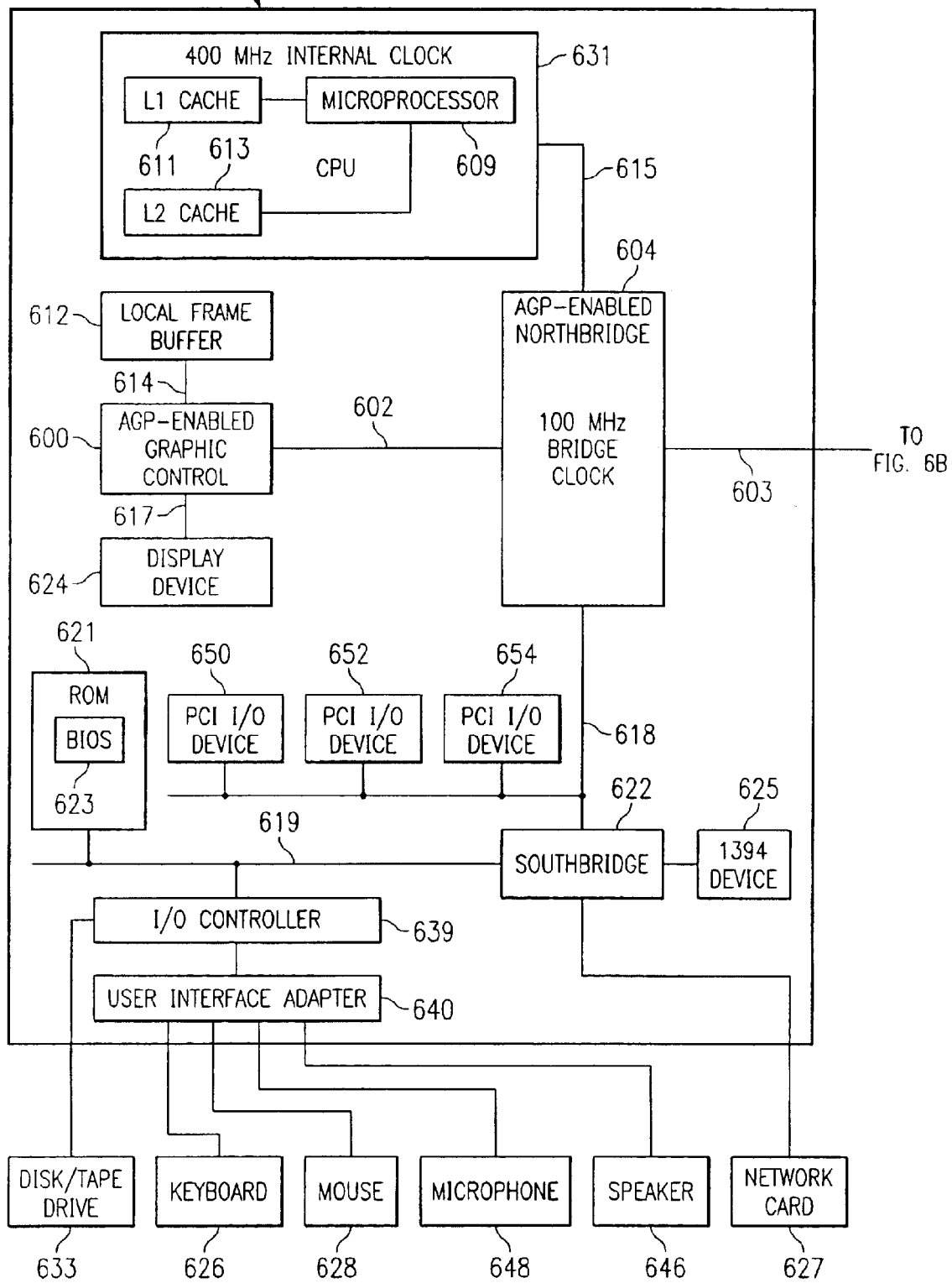

Referring now to FIGS. 6A and 6B, depicted is motherboard 202 and riser card 245 having selected components of data processing system 520 in which Double Density PCI socket 200 and PCI board edge connector 250, modified as described in relation to FIGS. 1A through 1F, 3 and 4, may be implemented. Data processing system 520 includes Central Processing Unit ("CPU") 631 (wherein axe depicted microprocessor 609, L1 Cache 611, and L2 Cache 613). CPU 631 is coupled to CPU bus 615.

CPU bus 615 is coupled to AGP-enabled Northbridge 604, which serves as a "bridge" between CPU bus 615, AGP interconnect 602 (a type of data bus), and system memory bus 603. In going from one type of bus to another type of bus, a "bridge" is generally needed because the two different type buses speak a different "language." The term "AGP-enabled" is intended to mean that the so-referenced components are engineered such that they interface and function under the standards defined within the AGP interface specification (Intel Corporation, Accelerated Graphics Port Interface Specification).

Generally, each bus in a system utilizes an independent set of protocols (or rules) to conduct data, which are generally set forth in a product specification uniquely tailored to the type of bus in question (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 604, as well as the Southbridge 622, in that it is to be understood that such bridges can translate and coordinate between various data buses and/or devices which communicate through the bridges.

AGP interconnect 602 interfaces with AGP-enabled graphics controller 600, which interconnects with local frame buffer 612 via frame buffer bus 614. AGP-enabled graphics controller 600 also interconnects with video display device 624 via video display bus 617.

AGP-enabled Northbridge 604 interfaces with system memory bus 603. System memory bus 603 interfaces with system memory 616, which can contain various types of memory devices such as DRAM chip 630, but which also can contain synchronous DRAM, RAMBUS DRAM, other type memory chips. In one embodiment, system memory bus 603 consists of several metallic traces (each similar to RAMBUS signal line described above), system memory 616 consists of RAMBUS DRAM chips mounted on a riser card, and system memory bus 603 is connected with system memory 616 by Double Density PCI socket 200 and Double Density PCI board edge connector 250 modified as described above such that Double Density PCI socket 200 and Double Density PCI board edge connector 250 substantially comply with the RAM bus electrical impedance specification.

Further shown for sake of illustration is that data processing system 520 includes control program 651 which resides within system memory 616 and which is executed and/or operated on by CPU 631. Control program 651 contains instructions that when executed on CPU 631 carries out application program (e.g., videoconferencing software) operations.

AGP-enabled Northbridge 604 interfaces with Peripheral Component Interconnect (PCI) bus 618, upon which are shown various PCI Input-Output (I/O) devices 650, 652, and 654. Peripheral Component Interconnect (PCI) bus 618 interfaces with Southbridge 622.

I/O bus 619 interfaces with I/O controller 639 for connecting peripheral devices (e.g., disk and tape drives 633) to I/O bus 619. I/O controller 639 interfaces with user interface adapter 640 for connecting keyboard 626, mouse 628, speaker 646, microphone 648, and/or other user interface devices, such as a touch screen device (not shown), to I/O bus 619 through I/O controller 639.

Video display device 624 is the visual output of data processing system 520, which can be a CRT-based video display well-known in the art of computer hardware. However, with a portable or notebook-based computer, video display device 624 can be an LCD-based, or a gas plasma-based, or any other type of flat-panel display.

Any suitable machine-readable media may retain the graphical user interface, such as DRAM 630, ROM 621, a magnetic diskette, magnetic tape, or optical disk (the last three being located in disk and tape drives 633). Any suitable operating system such as one having an associated graphical user interface (e.g., MICROSOFT WINDOWS operating system) may direct CPU 631. Other technologies can also be utilized in conjunction with CPU 631, such as touch-screen technology or human voice control.

Those skilled in the art will appreciate that the hardware depicted in FIG. 6 may vary for specific applications. For example, other peripheral devices such as optical disk media, audio adapters, video cameras such as those used in videoconferencing, or programmable devices, such as PAL or EPROM programming devices well-known in the art of computer hardware, and the like may be utilized in addition to or in place of the hardware already depicted.

Those skilled in art will recognize that data processing system 520 can be described in relation to data processing systems which perform essentially the same functions, irrespective of architectures. As an example of such, additional or alternative aspects of data processing system 520 are set forth in FIGS. 6A and 6B.

The foregoing components and devices are used herein as examples for sake of conceptual clarity. Thus, CPU 631 is utilized as an exemplar of any general processing unit, including but not limited to multiprocessor units; CPU bus 615 is utilized as an exemplar of any processing bus, including but not limited to multiprocessor buses; PCI devices 650–654 attached to PCI bus 618 are utilized as exemplars of any input-output devices attached to any I/O bus; AGP Interconnect 602 is utilized as an exemplar of any graphics bus; AGP-enabled graphics controller 600 is utilized as an exemplar of any graphics controller; Northbridge 604 and Southbridge 622 are utilized as exemplars of any type of bridge; 1394 device 625 is utilized as an exemplar of any type of isochronous source; and network card 627, even though the term "network" is used, is intended to serve as an exemplar of any type of synchronous or asynchronous input-output card. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

Other Embodiments

Several various embodiments have been described above, and it will be obvious to those skilled in the art that, based upon the teachings herein, changes and modifications may be made without departing from this invention and its broader aspects. That is, all examples set forth herein are intended to be exemplary and non-limiting. For example, non-Connector Specification printed circuit board connectors other than PCI Double Density Connectors can be adapted in the spirit of the process, devices, and examples described herein. In addition, the process, devices, and examples set forth herein can be applied to data processing system components other than connectors, such as for example series components such as resistors, inductors, or PCB vias.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For example, as an aid to understanding, the following appended claims may contain usage of the phrases "at least one" or "one or more," or the indefinite articles "a" or "an," to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements.

What is claimed is:

1. A method comprising:
    exciting a printed circuit board circuit having mismatched impedance printed circuit board components, the mismatched impedance printed circuit board including at least one Connector Specification component and at least one non-Connector Specification component;
    measuring at least one impedance of the circuit with a time domain reflectometer; and
    adjusting at least one printed circuit board circuit element, in response to the measured at least one impedance of the circuit.

2. The method of claim 1, wherein said exciting the printed circuit board circuit having the at least one Connector Specification component and the at least one non-Connector Specification component further includes:
    exciting the printed circuit board circuit having at least one Connector Specification trace and at least one PCI printed circuit board connector.

3. The method of claim 1, wherein said exciting the printed circuit board circuit having mismatched impedance printed circuit board components further comprises:
    exciting the printed circuit board circuit having mismatched impedance printed circuit board components with the time domain reflectometer.

4. A method comprising:
    exciting a printed circuit board circuit having mismatched impedance printed circuit board components;

measuring at least one impedance of the circuit with a time domain reflectometer; and adjusting the at least one printed circuit board circuit element, in response to the measured at least one impedance of the circuit, wherein the adjusting step further includes:

comparing the measured at least one impedance with a defined baseline impedance; and in response to a determination that a difference between the defined baseline impedance and the measured at least one impedance exceeds a defined tolerance, adjusting the at least one printed circuit board element such that the measured at least one impedance moves toward the defined baseline impedance.

5. The method of claim 4, wherein said adjusting the at least one printed circuit board element such that the measured at least one impedance moves toward the defined baseline impedance further comprises:

adjusting a first printed circuit board element identified as substantially responsible for the measured at least one impedance.

6. The method of claim 5, wherein said adjusting the first printed circuit board element identified as substantially responsible for the measured at least one impedance further includes:

connecting a first end of a shorting strap to a first via and a second end of the shorting strap to a second via.

7. The method of claim 4, wherein said adjusting the printed circuit board element such that the measured at least one impedance moves toward the defined baseline impedance further includes:

adjusting a second printed circuit board element electrically adjacent to the first printed circuit board element identified to be substantially responsible for the measured at least one impedance, such that the second printed circuit board element produces a reflected energy effect opposite that of the first printed circuit board element.

8. The method of claim 7, wherein said adjusting the second printed circuit board element electrically adjacent to the first printed circuit board element identified to be substantially responsible for the measured at least one impedance, such that the second printed circuit board element produces the reflected energy effect opposite that of the first printed circuit board element further includes:

increasing a capacitive effect of the second printed circuit board element if the first printed circuit board element has an inductive effect and increasing the inductive effect of the second printed circuit board element if the first printed circuit board element has the capacitive effect.

9. The method of claim 7, wherein said adjusting the second printed circuit board element electrically adjacent to the first printed circuit board element identified to be substantially responsible for the measured at least one impedance, such that the second printed circuit board element produces the reflected energy effect opposite that of the first printed circuit board element further includes:

introducing the second printed circuit board element substantially adjacent to the first printed circuit board element.

10. A method comprising:

exciting a printed circuit board circuit having mismatched impedance printed circuit board components;

measuring at least one impedance of the circuit with a time domain reflectometer; and adjusting the at least one printed circuit board circuit element, in response to the measured at least one impedance of the circuit;

wherein adjusting an electrical characteristic of the at least one printed circuit board circuit element if an absolute value of a maximum measured impedance variation above a defined baseline impedance substantially varies from an absolute value of a maximum measured impedance variation below the defined baseline impedance.

11. The method of claim 10, wherein said adjusting the electrical characteristic of the at least one printed circuit board circuit element if the absolute value of the maximum measured impedance variation above the defined baseline impedance substantially varies from the absolute value of the maximum measured impedance variation below the defined baseline impedance further includes:

adjusting the electrical characteristic of the first printed circuit board element such that the absolute value of the maximum measured impedance variation above the defined baseline impedance and the absolute value of the maximum measure impedance variation below the defined baseline impedance become practicably equivalent.

12. A computer system comprising:

one or more printed circuit boards having at least one circuit wherein reside substantially mismatched impedance printed circuit board components;

an impedance-variation equalizing distribution of at least one printed circuit board element operably coupled with the substantially mismatched impedance printed circuit board components;

the at least one printed circuit board element which renders impedance variations above and below a defined baseline impedance practicably equivalent; and the one or more printed circuit boards operably connecting at least one processor and at least one memory.

13. The computer system of claim 12, wherein the at least one printed circuit board element which renders impedance variations above and below the defined baseline impedance practicably equivalent further includes:

the printed circuit board element having an associated inductive effect.

14. The computer system of claim 12, wherein the at least one printed circuit board element which renders impedance variations above and below the defined baseline impedance practicably equivalent further includes:

the printed circuit board element having an associated capacitive effect.

15. The computer system of claim 12, wherein the at least one printed circuit board element which renders impedance variations above and below the defined baseline impedance practicably equivalent further includes:

a first printed circuit board element having the associated inductive effect operably connected with a second printed circuit board element having the associated capacitive effect.

16. A computer system comprising:

one or more printed circuit boards having at least one circuit wherein reside substantially mismatched impedance printed circuit board components;

an impedance-variation equalizing distribution of at least one printed circuit board element operably coupled with the substantially mismatched impedance printed circuit board components;

the at least one printed circuit board element which renders impedance variations above and below a defined baseline impedance practicably equivalent; and the one or more printed circuit boards operably connecting at least one processor and at least one memory; wherein the substantially mismatched impedance printed circuit board components including at least one Connector Specification component operably connected with at least one non-Connector Specification component.

17. The computer system of claim 16, wherein the at least one Connector Specification component operably connected with at least one non-Connector Specification component further includes:

the at least one Connector Specification component operably connected with at least one PCI specification socket.

18. The computer system of claim 17, wherein the at least one Connector Specification component operably connected with the at least one PCI specification socket further includes:

a first PCI specification socket connector wiper and a second PCI specification socket connector wiper operably coupled by a shorting strap.

19. The computer system of claim 18, wherein the first PCI specification socket connector wiper and the second PCI specification socket connector wiper operably coupled by the shorting strap further includes:

a first and a second via on a first printed circuit board operably coupled by the shorting strap.

20. The computer system of claim 16, wherein the at least one Connector Specification component operably connected with the at least one non-Connector Specification component further includes:

the at least one Connector Specification component operably coupled with at least one non-Connector Specification fingerpad.

21. The computer system of claim 20, wherein the at least one Connector Specification component operably coupled with the at least one non-Connector Specification fingerpad further includes:

the at least one Connector Specification component operably coupled with a one-piece fingerpad.

22. The computer system of claim 16, wherein the at least one Connector Specification component operably connected with the at least one non-Connector Specification component further includes:

the at least one Connector Specification component operably coupled with at least one via.

23. The computer system of claim 16, wherein the at least one Connector Specification component operably connected with the at least one non-Connector Specification component further includes:

the at least one Connector Specification component operably coupled with at least one compensation pad.

* * * * *